SEMICONDUCTOR LEADS AND METHOD OF ATTACHING

WILLIAM SHOCKLEY &
ARNOLD O. BECKMAN
INVENTORS

BY [signature]
ATTORNEYS

April 23, 1963 W. SHOCKLEY ET AL 3,086,281

SEMICONDUCTOR LEADS AND METHOD OF ATTACHING

Filed May 6, 1957 2 Sheets-Sheet 2

WILLIAM SHOCKLEY &
ARNOLD O. BECKMAN
INVENTORS

BY [signature]
ATTORNEYS

United States Patent Office 3,086,281
Patented Apr. 23, 1963

3,086,281

SEMICONDUCTOR LEADS AND METHOD OF ATTACHING

William Shockley, 23466 Corta Via, Los Altos, Calif., and Arnold O. Beckman, 2166 E. Crescent Drive, Altadena, Calif.

Filed May 6, 1957, Ser. No. 657,295
6 Claims. (Cl. 29—155.55)

This invention relates generally to a method of attaching leads to semiconductor devices, and more particularly to a method of attaching a plurality of leads in one operation.

Semiconductor devices have been formed by such methods as diffusion, doping during crystal growing and rate growing techniques, among others. In the crystal growing and rate growing processes, the compositional structure which includes the p-n junctions is formed in the ingot of material. The ingot is appropriately sliced and diced to form individual semiconductive devices. In the diffusion process, the ingot of material which is suitably doped is sliced and diced. Each of the dice is subjected to a diffusion operation to form the desired compositional structure which includes the p-n junctions.

In all of the prior art methods of forming semiconductor devices, leads are attached individually to the devices. Since the devices are relatively small, it is difficult and time consuming to attach the required leads.

It is an object of the present invention to provide an improved method for attaching leads to semiconductor devices.

It is another object of the present invention to provide a method for attaching a plurality of leads to a wafer of material having the desired compositional structure of p-n junctions.

It is a further object of the present invention to provide a method for attaching a plurality of leads at predetermined points on a wafer of semiconductive material.

It is another object to provide a method for attaching a plurality of leads to a semiconductor wafer in such a manner that individual devices which are subsequently formed may be used in automatic assembling machinery for placing the devices in circuits.

It is another object of the present invention to provide a method for attaching a plurality of leads to a wafer of semiconductive material whereby the wafer may be subsequently diced to form a plurality of semiconductor devices.

It is still another object of the present invention to provide a method for attaching a plurality of leads to a wafer of semiconductive material by making a plurality of low resistance bonds between a sheet of metal and the wafer of material.

It is another object of the present invention to provide a method for attaching a plurality of leads to a wafer of semiconductor material containing a compositional structure of p-n junctions in which a multiplicity of low resistance bonds are made with a sheet of metal at predetermined points on said wafer. The sheet is subsequently operated upon to form leads and the wafer is diced to form semiconductor devices.

It is a further object of the present invention to provide a method for attaching leads to a plurality of semiconductor devices in which a plurality of low resistance contacts are made at predetermined points on a wafer with a sheet of metal. The sheet is subsequently separated to form leads which are bonded to the wafer and the wafer is diced to form a plurality of devices having leads attached thereto.

The invention possesses other objects and features of advantage, some of which, with the foregoing, will be set forth in the following description of the invention. It is to be understood that the invention is not to be limited to the disclosure of the particular methods described as other variant methods may be adapted which are within the scope of the claims.

Referring to the attached drawings.

Figures 1, 2:
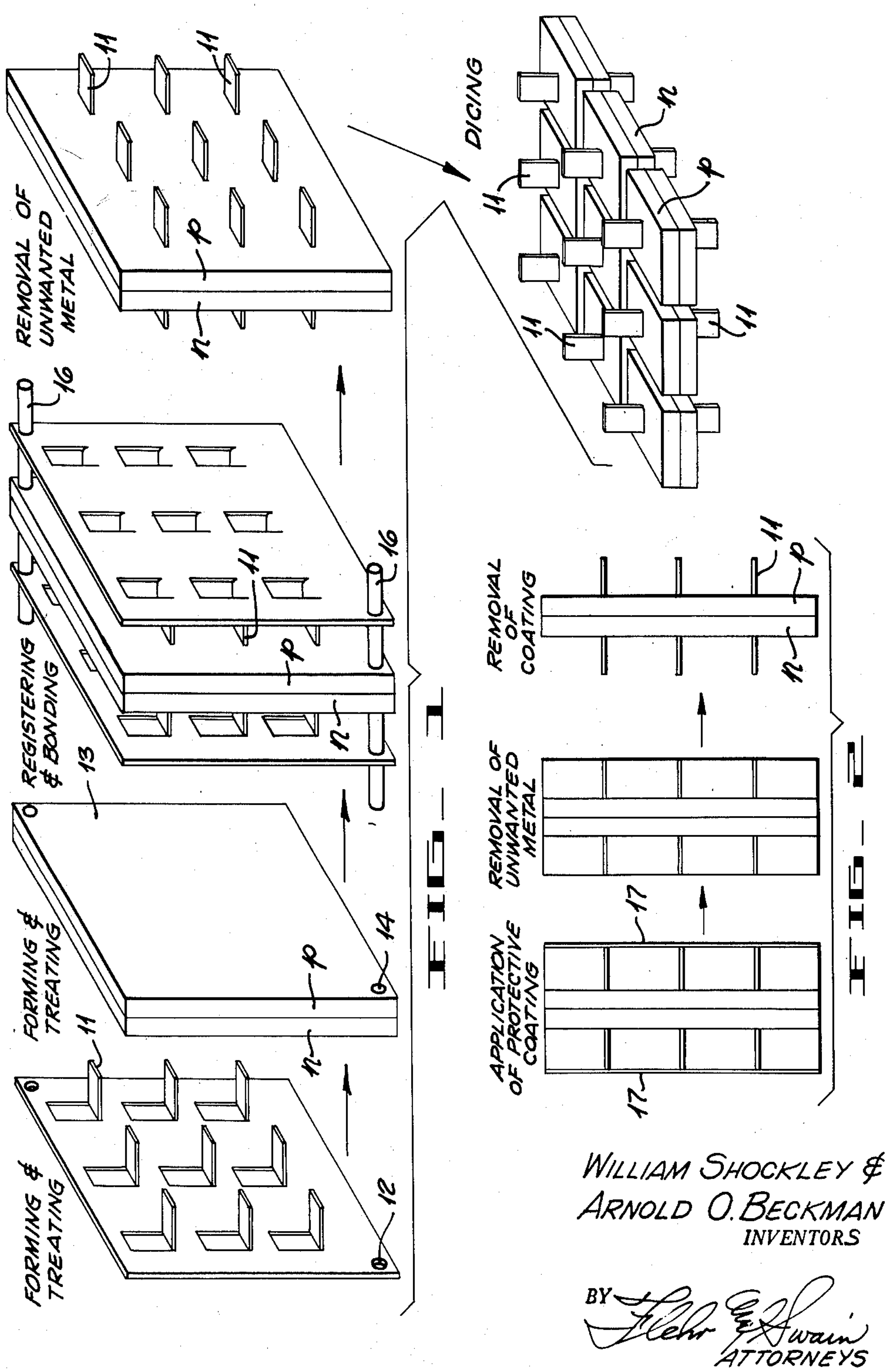
FIGURE 1 is a flow chart, in diagrammatic form, of one method of carrying out the present invention.
FIGURE 2 is a flow chart showing in more detail one of the steps of FIGURE 1.

FIGURE 1 shows one of the methods of attaching a plurality of leads to a semiconductive wafer. The first step in the method is to form a lead sheet. The type of metal used for the lead sheet depends upon the thickness and the particular application, for example, copper or nickel may be employed. The sheet is punched or otherwise operated upon to form a plurality of tongues (leads) 11 of metal which extend away from the sheet. As will presently become apparent, these tongues of metal subsequently become the leads for the semiconductor devices. For many purposes, the leads are formed with adequate precision in a single punching operation. However, it may be desirable to adjust the plate after the leads are formed by compressing and possibly annealing the lead sheet so that the ends of the tongues 11 lie on a common plane. It may also be desirable in certain instances to lap the ends of the tongues 11.

In the punching operation, openings 12 which are suitable for guiding or registering the plate with the wafer with which it is associated may be provided. The sheet may also be registered by guiding the edges of the sheet as it is brought into contact with the wafer, as will be presently described.

It is assumed that a wafer 13 of semiconductive material having the desired compositional structure has been formed. For example, the structure may include one or more p-n junctions. In the illustration and description which follows, wafer 13 having a single p-n junction is referred to. It is to be understood, of course, that this is merely for purposes of illustration and that the invention is not to be limited in this respect as the method is applicable for other devices such as field effect transistors, analog transistors, photoconductive devices, etc. The wafer has its upper and lower surfaces substantially parallel and plane. If holes 12 are provided for registering the metallic sheets with the wafer, it is desirable to form holes 14 in the wafer to receive a guide pin, as will be presently described.

A layer of bonding metal, for example, solder, is formed on the surfaces of the wafer or on the surfaces of the tongues 11. For example, the tongues may be dipped in solder to form the layer. Alternatively, the wafer may be nickel-plated and then a thin layer of solder may be superimposed on the nickel layer. Other combinations of methods for preparing the surfaces so that they will bond will be apparent to those versed in the art.

A pair of metallic sheets including the tongue-like leads are then registered with the wafer. For example, pins 16 may extend through the holes 14 of the wafer and serve to engage the holes 12 of the sheets. The sheets are brought toward the wafer so that the ends of the tongues engage the outer surfaces of the wafer. The wafer and the lead sheets may be brought into registry by other means, for example, the side edges of the same may be guided. In certain instances several lead sheets may be employed with the tongues of one registering with the openings of the next one. In this manner it is possible to obtain closer spacing of the tongues, if necessary.

The assembly is then subjected to slight compression pressure and heated in a suitable oven to a temperature which is above the melting point of the bonding metal. Under these conditions, the bonding metal melts and a slight inward motion of the tongues may occur in the event they are not pressed tightly against the wafer. Upon cooling, the ends of the tongue are bonded to the wafer in desired predetermined locations which correspond to the location of the tongues 11. Thus, it is seen that a structure is formed which comprises a semiconductor block having a plurality of tongues making contact therewith. The tongues (leads) are held by the main body of the metallic sheets from which they were pressed.

Tongues of metal on the lead sheet are converted into leads by removing the unwanted metal. For example, the entire unit may be cast in a protective material, for example, wax, to form a block such as shown in FIGURE 2. The outer surfaces 17 of the lead sheets are then cleaned. The unit is dipped in a suitable etch, for example, an acid bath, which serves to eat away all of the exposed metal, leaving the tongues which are protected intact. Various waxes or paints well known in the art may be used for the protective purposes. It is not necessary to cast the entire unit in a block of protective material as described. It may be dipped in a solution of protective material which forms a skin over the parts and which is then allowed to dry. The surfaces which are to be etched may then be removed by suitable solvents or by abrasion. The unwanted material may be removed by mechanical means rather than by chemical etches. For example, the unwanted metal may be removed by grinding.

The wax or other protective coating may then be removed. The resulting structure is then a wafer with an assemblage of outwardly extending leads 11.

In certain applications it is desirable to separate the wafer into individual devices. This may be carried out by mechanical or chemical means. The unit may be mounted in a handling block. The wafer may then be mechanically diced by suitable cutters, for example, an array of diamond saws. Alternatively, the block may be cut by a magnetorestrictive cutter having a number of blades arranged in a suitable array whereby individual units are produced. Another well known method of forming the individual units is to scribe the wafe and then to break it up into individual pieces.

Chemical means for separating may comprise leaving the protective coating previously described on the wafer, scribing through the coating to the underlying wafer. The complete unit is then dipped in an etching bath. Alternatively, the unit which has been cleaned may be masked with a grid-like network of wires and then suitable protective coating applied thereto. The protective coating is thus not applied behind the wires leaving the wafer exposed. The assembly is then etched.

Throughout these latter operations, the complete unit may be mounted in a handling block which is inert to the etching solution. The handling block may be cut up into strips whereby the devices are in line for mechanized assembly. Alternatively, the lead sheet may be left intact on one side and the units separated as discussed above. Under these conditions, the devices will be attached to one of the lead sheets in a predetermined array. This may be desirable in certain assembly operations or for making composite devices in which all the units are connected to a common terminal. The lead sheet may be cut or etched in various ways to provide desired configurations of devices carried by a sheet. The assemblies so provided may be sold as a separate unit for assembly into final circuits as described.

Figure 3:
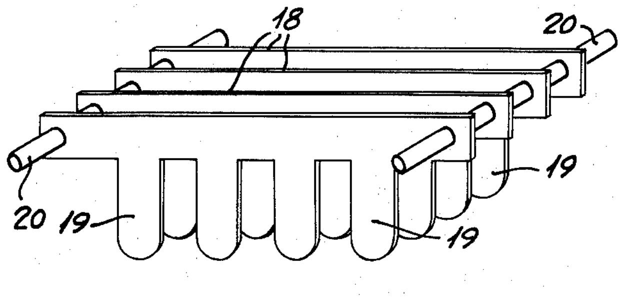
FIGURE 3 shows another possible design of a lead sheet.

Other means may be employed for forming a plurality of tongues of leads. A plurality of single sheets 18 (FIGURE 3) may be formed as shown, for example, by photoengraving or punching to form a plurality of tongues 19 which extend away from a common rib. Registration means such as post 20 serves to hold these sheets in a predetermined array. Spacers may be provided between sheets to accurately space the tongues 19 one from the other. The assembly may be then mounted on a suitable jig and the operations described with reference to FIGURE 1 carried out to form a plurality of devices having leads connected thereto. However, in this method, the tongues on one side may be left connected to the ribs. The wafer is then diced to give a plurality of devices which are carried in line on the individual ribs. These ribs may then be placed in line and fed into automatic equipment.

Figure 4:
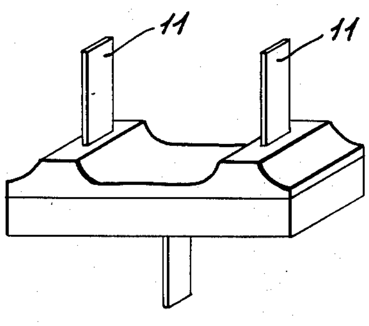
FIGURE 4 shows a field effect transistor constructed in accordance with the process shown in FIGURE 1.

Referring to FIGURE 4, a field effect transistor structure of the type described in copending application entitled "Transistor Structure and Method," Serial No. 652,117, filed April 11, 1957, is shown with leads 11 attached thereto in accordance with the method of FIGURE 1.

Figure 5:
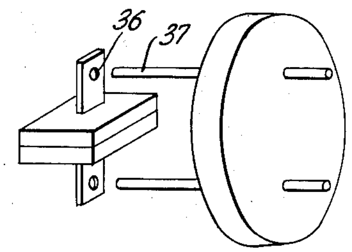
FIGURE 5 shows a pair of leads suitable for mounting on a header.

Referring to FIGURE 5, it is seen that the leads may be provided with holes 36 which serve to receive the leads 37 of an associated header whereby the same may be rapidly and easily attached to the same.

It is seen that a method for attaching a plurality of leads to a wafer having a compositional structure is provided. The devices may be held in predetermined patterns which are suitable for automatic assembly.

We claim:

1. The method of attaching leads to a plurality of semiconductor devices in one operation which comprises forming a lead assembly by punching tongues in a sheet of lead material, which tongues extend outwardly with their end portions in a common plane, bringing said end portions in contact with the surface of a wafer of semiconductor material having the desired compositional structure, bonding said end portions to the wafer and subsequently dicing the wafer to form devices having leads attached thereto.

2. The method of attaching leads to a plurality of semiconductor devices which comprises punching a sheet of conductor material to form a plurality of outwardly extending tongues, said tongues having their end portions lying in a common plane, bringing the end portions of said tongues simultaneously into contact with a wafer of semiconductor material having the desired compositional structure, simultaneously bonding said tongues to said wafer to form low resistance contacts, removing the sheet material intermediate predetermined ones of the tongue, and dicing said wafer to form a plurality of semiconductor devices.

3. As a transitory article of manufacture, a first and a second unit, said first unit comprising a wafer of semiconductor material having the desired compositional structure, said second unit comprising a lead assembly including a sheet of lead material having a plurality of outwardly extending tongues at predetermined points, said lead assembly being in contact with said wafer at predetermined points defined by the ends of the tongues, said contacts being low resistance bonds.

4. A transitory article as defined in claim 3 wherein the end portions of said tongue lie in a common plane.

5. As a transitory article of manufacture, a diced wafer of semiconductor material having the desired compositional structure, and a lead assembly comprising a sheet of lead material having a plurality of outwardly extending tongues thereon in contact with said wafer at a plurality of points corresponding to the diced portions thereof, said contacts being low resistance bonds, the diced portions of said wafer being joined together only by said lead assembly at said contacts.

6. A transitory article as defined in claim 5 wherein the end portions of said tongue lie in a common plane.

(References on following page)

References Cited in the file of this patent

UNITED STATES PATENTS

| | | |
|---|---|---|
| 2,121,597 | Karl | June 21, 1938 |
| 2,321,071 | Ehrhardt et al. | June 8, 1943 |
| 2,381,025 | Addink | Aug. 7, 1945 |
| 2,444,255 | Hewlett | June 29, 1948 |
| 2,670,530 | Regnier | Mar. 2, 1954 |
| 2,689,930 | Hall | Sept. 21, 1954 |
| 2,705,767 | Hall | Apr. 5, 1955 |
| 2,743,506 | Solow | May 1, 1956 |
| 2,744,308 | Loman | May 8, 1956 |
| 2,748,041 | Levernez | May 29, 1956 |
| 2,758,183 | Canegallo | Aug. 7, 1956 |
| 2,762,954 | Leifer | Sept. 11, 1956 |
| 2,777,192 | Albright et al. | Jan. 15, 1957 |
| 2,778,980 | Hall | Jan. 22, 1957 |
| 2,804,581 | Lichtgarn | Aug. 27, 1957 |
| 2,845,693 | Shetterly et al. | Aug. 5, 1958 |
| 2,865,082 | Gates | Dec. 23, 1958 |

FOREIGN PATENTS

| | | |
|---|---|---|
| 529,792 | Great Britain | Nov. 28, 1940 |
| 809,877 | Great Britain | Mar. 4, 1959 |